(12) United States Patent
Ke

(10) Patent No.: US 6,847,233 B1
(45) Date of Patent: Jan. 25, 2005

(54) EMITTER COUPLED LOGIC CIRCUIT WITH A DATA RELOAD FUNCTION

(75) Inventor: Ling-Wei Ke, Tainan (TW)

(73) Assignee: MediaTek Inc., Hsin Chu (TW)

(*) Notice: Subject to any disclaimer, the term of this patent is extended or adjusted under 35 U.S.C. 154(b) by 0 days.

(21) Appl. No.: 10/602,709

(22) Filed: Jun. 25, 2003

Related U.S. Application Data

(63) Continuation-in-part of application No. 10/190,559, filed on Jul. 9, 2002, now abandoned.

(30) Foreign Application Priority Data

Jul. 12, 2001 (TW) ........................ 90117157 A

(51) Int. Cl.[7] ............................................ H03K 19/086
(52) U.S. Cl. ........................................ 326/126; 326/66
(58) Field of Search ................. 326/126–127, 326/124, 66, 67, 77, 78

(56) References Cited

U.S. PATENT DOCUMENTS

| | | | |
|---|---|---|---|
| 4,546,272 A | 10/1985 | Suzuki et al. | |
| 4,551,639 A | 11/1985 | Takeda et al. | |
| 4,714,841 A | 12/1987 | Shoji et al. | |
| 4,806,796 A | * 2/1989 | Bushey et al. | 326/126 |
| 4,991,141 A | * 2/1991 | Tran | 365/207 |
| 5,214,317 A | 5/1993 | Nguyen | |
| 5,717,347 A | * 2/1998 | Dufour | 326/127 |
| 5,742,551 A | 4/1998 | Yukutake et al. | |

* cited by examiner

Primary Examiner—James H. Cho
(74) Attorney, Agent, or Firm—Birch, Stewart, Kolasch & Birch, LLP

(57) ABSTRACT

An emitter coupled logic circuit with a data reload function is disclosed. The emitter coupled logic (ECL) circuit includes first and second in series transistors consisting of bipolar junction transistors (BJTs) and field effect transistors (FETs), respectively. The bipolar junction transistor receives a reload signal, and the field effect transistor receives a reload data. Therefore, using the serial control of the bipolar junction transistors together with the field effect transistors, the digital reload data may be reloaded into the ECL circuit. Since the invention utilizes the field effect transistors to directly receive and set the reload data, it is not necessary to pre-convert the digital reload data into a front-stage ECL voltage level. In addition, because the reload data can be sent to the field effect transistors before the reload signal enables, the field effect transistors may be set to ON or OFF in advance. Consequently, as soon as the reload signal RL is enabled, the states of the output terminals may be controlled according to the reload data so as to speed up the data reload operations.

5 Claims, 2 Drawing Sheets

EMITTER COUPLED LOGIC CIRCUIT WITH A DATA RELOAD FUNCTION

This application is a continuation-in-part of application Ser. No. 10/190,559 filed on Jul. 9, 2002 now abandoned.

BACKGROUND OF THE INVENTION

1. Field of the Invention

The invention relates to an emitter coupled logic (ECL) circuit, and more specifically to an emitter coupled logic circuit, which combines metal oxidation semiconductor field effect transistors (MOSFETs) to provide a data reload function.

2. Description of the Related Art

Since the emitter coupled logic (hereinafter referred to as ECL) circuits may operate in high speed, the ECL circuits have been widely used in logic gate circuits, such as D-Type flip-flops. FIG. 1 shows an ECL circuit disclosed in U.S. Pat. No. 4,546,272, which is entitled "ECL circuit for forcibly setting a high level output". The ECL circuit includes a pair of emitter coupled bipolar junction transistors TRI, TR2 and load resistors R1, R2 for receiving differential signals D and /D, a resistor $R_S$, a current source, and a pair of bipolar junction transistors TR3, TR4. The resistor $R_S$ is connected to the emitters of the bipolar junction transistors TR1, TR2. The current source is connected to the resistor $R_S$. The transistors TR3, TR4 are used for receiving a "set" S and "reset" R signals, respectively.

In the conventional ECL circuit, the resistor $R_S$ provides a voltage difference to make the base-emitter voltage difference (VBE3, VBE4) between the bipolar junction transistors TR3, TR4 greater than the base-emitter voltage difference (VBE1, VBE2) between the emitter coupled bipolar junction transistors TR1, TR2. Accordingly, the output signal can be forced to "set" or "reset" state.

The conventional ECL circuit provides the functions of "set" and "reset" other than the function of "reload". Since the ECL circuit is not a logic digital circuit with complementary metal oxidation semiconductor (CMOS) transistors, the ECL circuit cannot directly receive the digital reload data as the "set" signal and "reset" signal. Therefore, when the digital reload data is needed, it is necessary to judge that the reload data is logic high H or logic low L. If the reload data is H, the "set" signal is set to a high voltage level, and the "reset" signal is set to a low voltage level. Adversely, if the data is L, the "set" signal is set to a low voltage level, and the "reset" signal is set to a high voltage level. Thus, the design is complicated. Furthermore, it needs time to convert the reload data into ECL voltage levels, therefore the data reload speed may be delayed and influences the data reload speed of the ECL circuit.

SUMMARY OF THE INVENTION

In view of the above-mentioned problems, an object of the invention is to provide an ECL circuit having a data reload function.

Another object of the invention is to provide an ECL circuit having a data reload function, wherein the digital reload data can be directly coupled.

To achieve the above-mentioned objects, the ECL circuit with the data reload function of the invention includes a differential pair of bipolar junction transistors, a pair of load resistors, a resistor, a current source, first in series transistors, an inverter, and second in series transistors.

The differential pair of bipolar junction transistors includes a first bipolar junction transistor and a second bipolar junction transistor. Each of the bipolar junction transistors has an emitter connected to each other, and a base for receiving a differential signal. The pair of load resistors consists of a first load resistor and a second load resistor, and includes a first terminal connected to collectors of the differential pair of bipolar junction transistors, and a second terminal connected to a high operation voltage source. The resistor has a first terminal and a second terminal, wherein the first terminal is connected to the emitters of the differential pair of bipolar junction transistors. The current source has a first terminal connected to the second terminal of the resistor, and a second terminal connected to a low operation voltage source. The first in series transistors include a third bipolar junction transistor and a first field effect transistor. The third bipolar junction transistor has a collector connected to a collector of the first bipolar junction transistor, a base for receiving a reload signal, and an emitter connected to a drain of the first field effect transistor. The first field effect transistor has a source connected to the second terminal of the resistor, and a gate for receiving the reload data. The inverter is used for inverting and outputting the reload data. The second in series transistors include a fourth bipolar junction transistor and a second field effect transistor. The fourth bipolar junction transistor has a collector connected to a collector of the second bipolar junction transistor, a base for receiving the reload signal, and an emitter connected to a drain of the second field effect transistor. The second field effect transistor has a source connected to the second terminal of the resistor, and a gate for receiving output data from the inverter.

Since the invention utilizes the field effect transistors to directly receive and set the reload data, it is not necessary to pre-converting the digital reload data into ECL voltage level. In addition, the reload data can be sent to the field effect transistors before the reload signal enables. Therefore, the field effect transistors may be turned ON or OFF in advance. Consequently, as soon as the reload signal is enabled, the states of the output terminals may be controlled according to the reload data so as to speed up the data reload operations.

BRIEF DESCRIPTION OF THE DRAWINGS

These and other objects and advantages of the present invention will become apparent by reference to the following description and accompanying drawings wherein.

DETAILED DESCRIPTION OF THE INVENTION

Figure 2:
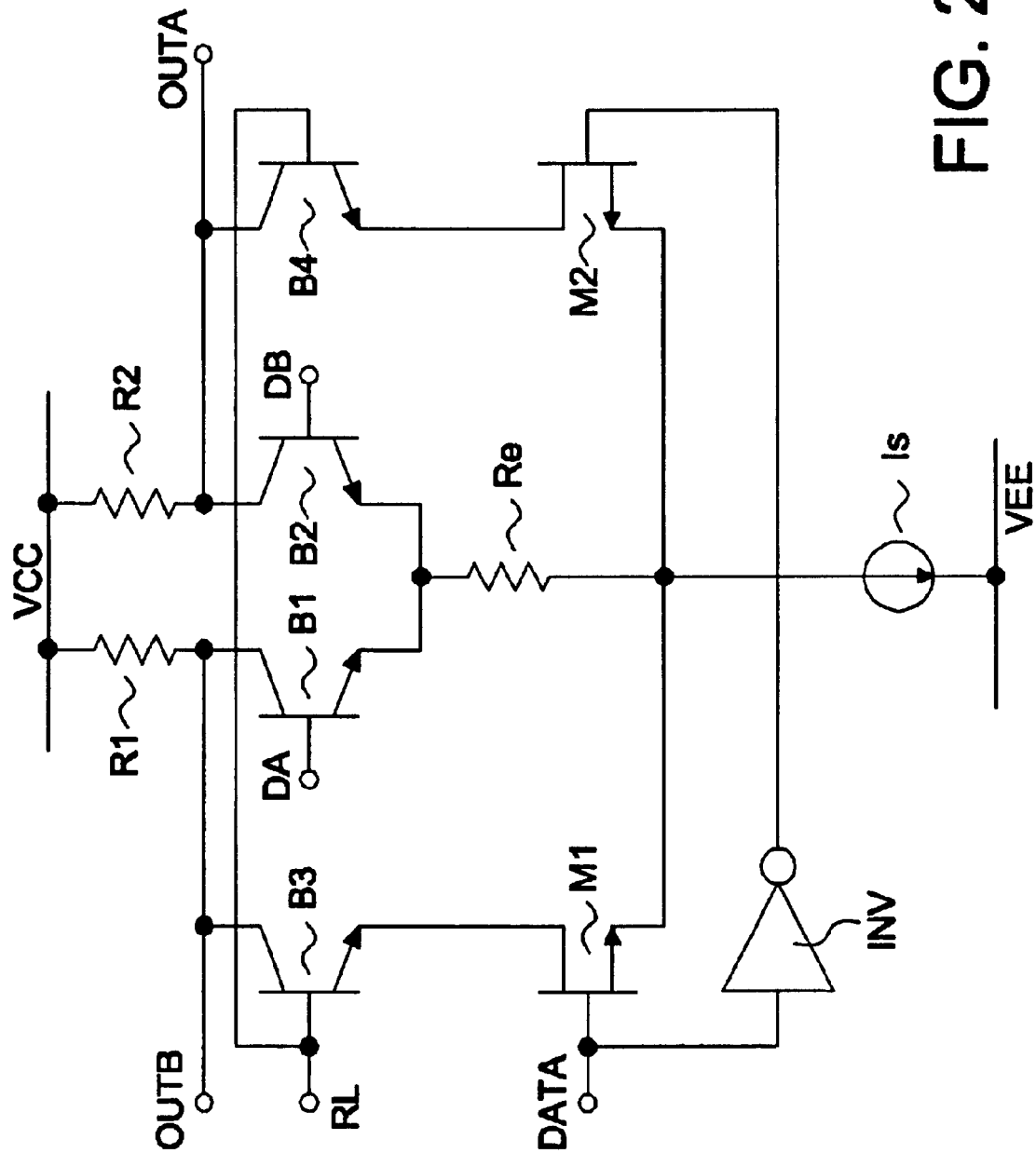
FIG. 2 shows an ECL circuit with a data reload function of the invention.

FIG. 2 shows the ECL circuit with a data reload function of the present invention. Referring to this drawing, the ECL circuit of the invention includes a differential pair of emitter coupled bipolar junction transistors B1, B2, a pair of load resistors R1, R2, a pair of reload control bipolar junction transistors B3, B4, a resistor Re connected to emitters of the pair of bipolar junction transistors B1, B2, a current source Is connected to the resistor Re, a pair of field effect transistors M1, M2 for receiving a reload data, and the output signal of an inverter INV.

The collectors of the emitter coupled bipolar junction transistors B1, B2 are connected to the high operation voltage source VCC via the resistors R1, R2, and the bases of the transistors B1, B2 receives differential signals DA, DB, respectively. The emitters of the emitter coupled bipolar junction transistors B1, B2 are connected to the low operation voltage source VEE via the resistor Re and the current source Is. The collector of the bipolar junction transistor B2 serves as an output terminal OUTA of the ECL circuit, while the collector of the bipolar junction transistor B1 serves as an inverting output terminal OUTB of the ECL circuit.

The collector of the reload control bipolar junction transistor B3 is connected to the collector of the bipolar junction transistor B1, and the base of the transistor B3 receives a reload signal RL. The drain of the field effect transistor M1 is connected to the emitter of the reload control bipolar junction transistor B3, the gate of the transistor M1 receives a reload data DATA, and the source of the transistor M1 is connected to the current source Is. The collector of the reload control bipolar junction transistor B4 is connected to the collector of the bipolar junction transistor B2, and the base of the transistor B4 receives the reload signal RL. The drain of the field effect transistor M2 is connected to the emitter of the reload control bipolar junction transistor B4, the gate of the transistor M2 receives the inverted reload data from the inverter, and the source of the transistor M2 is connected to the current source Is.

Figure 1:
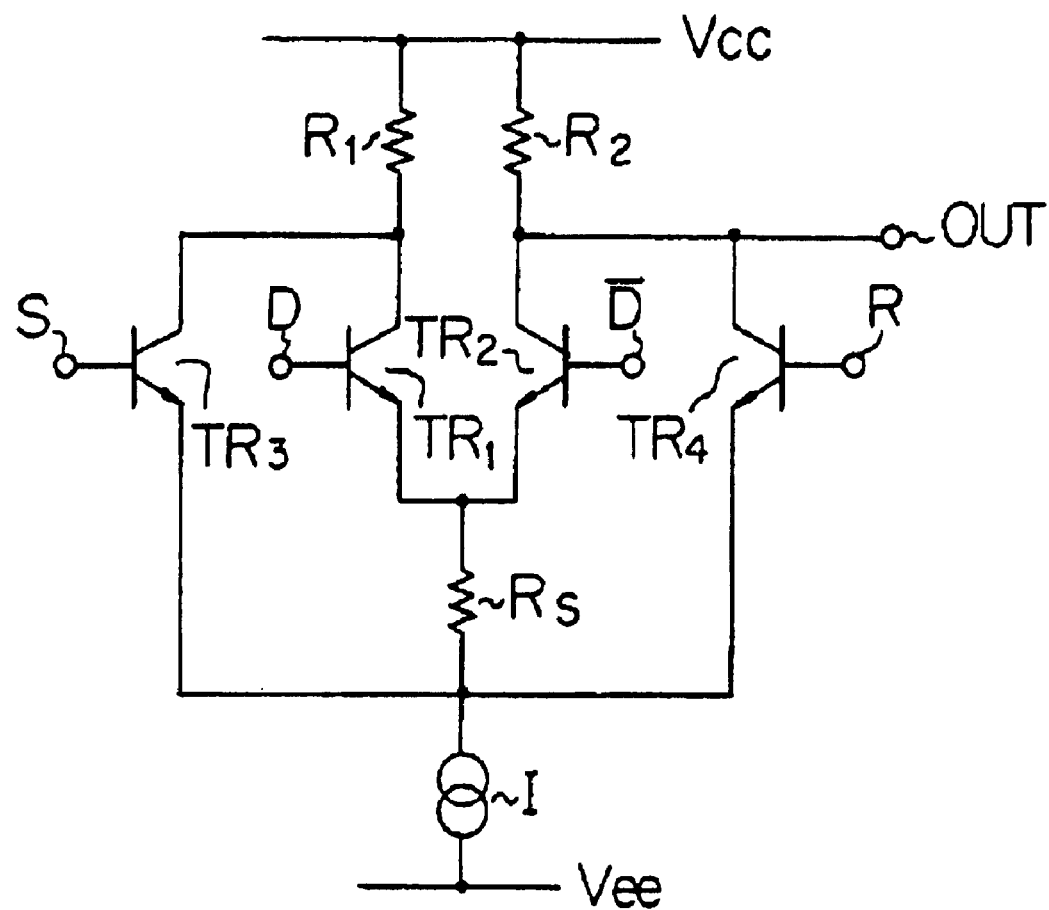
FIG. 1 shows a conventional ECL circuit.

Since the "turn ON" resistance of each of the field effect transistors M1 and M2 is far less than the resistance of the resistor Re, the combination of the reload control bipolar junction transistor B3 with the field effect transistor M1 has the same function as that of the bipolar junction transistor TR3 of the conventional ECL circuit (refer to FIG. 1). In addition, the combination of the reload control bipolar junction transistor B4 with the field effect transistor M2 has the same function as that the bipolar junction transistor TR4 of the conventional ECL circuit (refer also to FIG. 1). Therefore, when both of the reload control bipolar junction transistor B3 and the field effect transistor M1 are turned ON, the output terminal OUTA may be set to H. On the other hand, when both of the reload control bipolar junction transistor B4 and the field effect transistor M2 are turned ON, the output terminal OUTA may be set to L.

However, since the invention utilizes the field effect transistors M1 and M2 to directly receive and set the reload data, it is not necessary to pre-converting the digital reload data into ECL voltage level. In addition, because the reload data can be sent to the field effect transistors M1 and M2 before the reload signal is enabled, the field effect transistors M1 and M2 may be turned ON or OFF in advance. Consequently, as soon as the reload signal RL is enabled, the states of the output terminals OUTA and OUTB may be controlled according to the reload data DATA so as to speed up the data reload operations.

The operations of the ECL circuit of the invention will be described in the following. First, when the reload signal RL is L, both of the bipolar junction transistors B3, B4 are turned OFF. Therefore, the outputs of the ECL circuit are controlled by the differential signals DA and DB. Since the operation at this portion is the same as that in the prior art (FIG. 1), detailed description thereof is omitted.

When the reload signal RL is H, both of the bipolar junction transistors B3 and B4 are turned ON. At this time, if the reload data DATA is H, the field effect transistor M1 is turned ON while the field effect transistor M2 is turned OFF. Therefore, the output terminal OUTA of the ECL circuit is H while the output terminal OUTB is L. On the other hand, if the reload data DATA is L, the field effect transistor M1 is turned OFF while the field effect transistor M2 is turned ON. Therefore, the output terminal OUTA of the ECL circuit is L while the output terminal OUTB is H. Since the operation at this portion is the same as that in the prior art (FIG. 1), detailed description thereof is omitted.

While certain exemplary embodiment has been described and shown in the accompanying drawing, it is to be understood that such embodiment is merely illustrative of and not restrictive on the broad invention, and that this invention not be limited to the specific construction and arrangement shown and described, since various other modifications may occur to those ordinarily skilled in the art. For instance, the differential pair of bipolar junction transistors in FIG. 2 can be replaced by various emitter coupled logic architectures, such as AND, latch, and the like, without disabling the data reload function.

What is claimed is:

1. An emitter coupled logic circuit with a data reload function, comprising:

a differential pair of bipolar junction transistors having a first bipolar junction transistor and a second bipolar junction transistor, each of the bipolar junction transistors having an emitter connected to each other, and a base for receiving a differential signal;

a pair of load resistors consisting of a first load resistor and a second load resistor, each load resistor having a first terminal connected to the collector of the differential pair of bipolar junction transistors, and a second terminal connected to a high operation voltage source;

a resistor connected to the emitters of the differential pair of bipolar junction transistors;

a current source connected to the resistor and a low operation voltage source;

first in series transistors having a third bipolar junction transistor and a first field effect transistor, wherein the third bipolar junction transistor has a collector connected to a collector of the first bipolar junction transistor, a base for receiving a reload signal, and an emitter connected to a drain of the first field effect transistor, while the first field effect transistor has a source connected to the current source, and a gate for receiving the reload data;

an inverter for inverting the reload data; and second in series transistors having a fourth bipolar junction transistor and a second field effect transistor, wherein the fourth bipolar junction transistor has a collector connected to a collector of the second bipolar junction transistor, a base for receiving the reload signal, and an emitter connected to a drain of the second field effect transistor, while the second field effect transistor has a source connected to the current source, and a gate for receiving output data from the inverter.

2. The emitter coupled logic circuit according to claim 1, wherein the collector of the fourth bipolar junction transistor is a first output terminal.

3. The emitter coupled logic circuit according to claim 1, wherein the collector of the third bipolar junction transistor is a second output terminal.

4. The emitter coupled logic circuit according to claim 1, wherein the differential pair of bipolar junction transistors can be replaced by an AND architecture.

5. The emitter coupled logic circuit according to claim 1, wherein the differential pair of bipolar junction transistors can be replaced by a latch architecture.

* * * * *